United States Patent [19]

Wills et al.

[11] 4,418,639
[45] Dec. 6, 1983

[54] APPARATUS FOR TREATING SEMICONDUCTOR WAFERS

[75] Inventors: James C. Wills, Los Altos; Douglas S. Spenser, Santa Clara, both of Calif.

[73] Assignee: Solitec, Inc., Santa Clara, Calif.

[21] Appl. No.: 265,185

[22] Filed: May 19, 1981

[51] Int. Cl.$^3$ .................... B05C 11/02; B05C 13/02
[52] U.S. Cl. ........................... 118/50; 118/54; 118/59; 118/320
[58] Field of Search ............ 118/52, 54, 50, 59, 118/729, 730, 320; 427/240

[56] References Cited
U.S. PATENT DOCUMENTS

| | | | |
|---|---|---|---|
| 4,190,015 | 2/1980 | Hillman | 427/240 X |
| 4,208,159 | 6/1980 | Uehara et al. | 118/50 X |
| 4,315,705 | 2/1982 | Flint | 118/54 X |

*Primary Examiner*—John P. McIntosh
*Attorney, Agent, or Firm*—Limbach, Limbach & Sutton

[57] ABSTRACT

Apparatus for treating semiconductor wafers including a reciprocating wafer tray placed between a wafer loading station and a wafer unloading station. A station for applying photoresist and a station for heating the wafer in a vacuum chamber are placed between the loading station and the unloading station and in operative relationship to the reciprocating tray. The tray has at least three wafer carrying apertures and a pair of operating apertures located between the wafer carrying apertures. Chucks are provided at each treatment station. The wafer tray is reciprocated to feed wafers sequentially from the loading station, to the applying station, to the heating station, and then to the unloading station.

1 Claim, 2 Drawing Figures

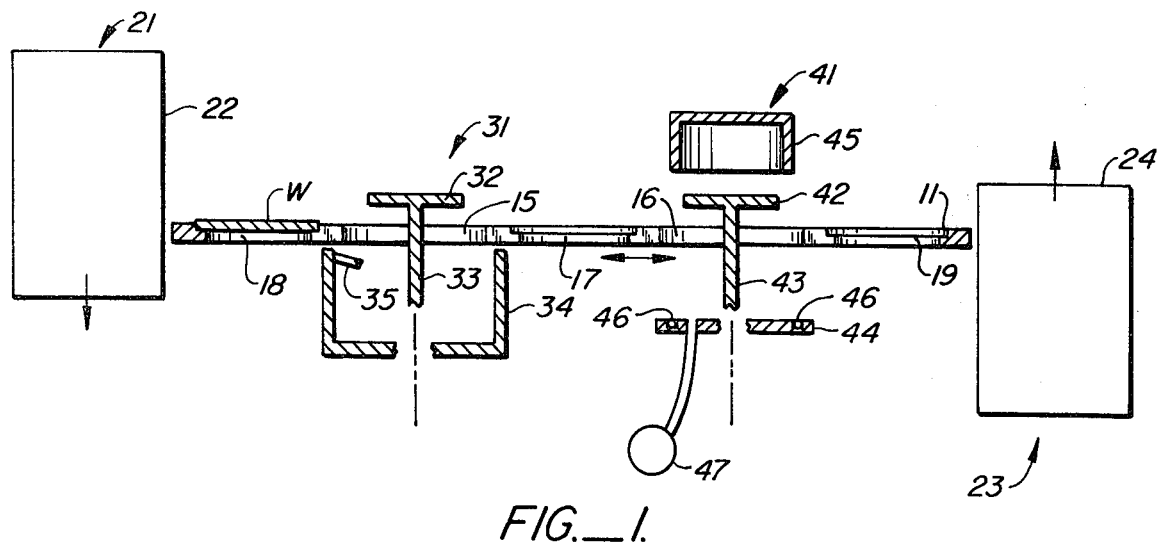
FIG._1.
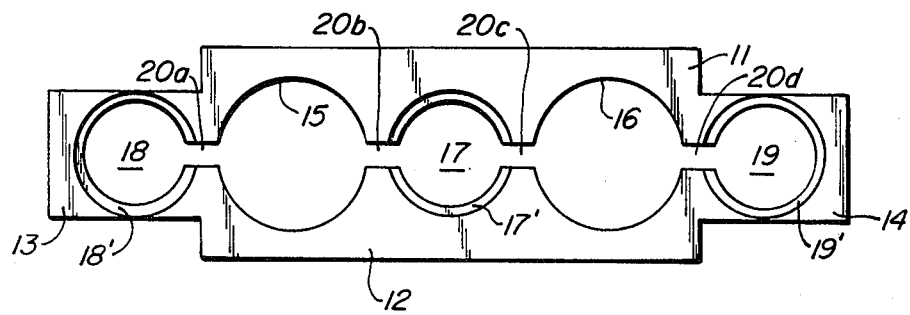
FIG._2.

APPARATUS FOR TREATING SEMICONDUCTOR WAFERS

The present application is directed to apparatus for treating semiconductors and more particularly to the application of a photoresist material to a wafer.

BACKGROUND OF INVENTION

In processing semiconductor wafers a layer of photoresist is applied evenly to the surface of the wafer. Problems have been encountered in rapidly drying the photoresist coating without adversely affecting the photoresist material and/or the wafer. Drying techniques have included microwave heating of the photoresist or evacuating the space surrounding the wafer to draw off vapors.

SUMMARY OF THE INVENTION

The object of the present invention is to provide an apparatus for rapidly drying a photoresist layer on a semiconductor.

Broadly stated, the present invention, to be described in greater detail below, is directed to apparatus for applying a photoresist material to a wafer and then simultaneously both conducting heat to the wafer and evacuating the space surrounding the wafer to dry the photoresist matrial on the wafer.

The apparatus in accordance with the present invention includes a reciprocating wafer tray having at least a pair of operating apertures for the application of and then the drying of the photoresist material located in between three wafer carrying apertures. Means are provided for reciprocating the tray back and forth between an input loading station and an output unloading station with first and second treating stations in between the loading and unloading stations. At each treating station the wafer is carried on a vertically reciprocal wafer chunk. A photoresist material is applied to a wafer at the first treating station, and at the second treating station means are provided for evacuating the space surrounding the wafer with applied photoresist and simultaneously conducting heat to the wafer from the wafer chuck.

DESCRIPTION OF THE DRAWINGS

FIG. 1 is a side elevational schematic view illustrating the present invention.

FIG. 2 is a plan view of the wafer transporting tray.

DESCRIPTION OF THE PREFERRED EMBODIMENT

While the present invention is applicable to various different treating steps in the process of manufacturing semiconductor wafers, it is particularly applicable to the step of applying and drying a layer of photoresist material on the semiconductor wafer and therefore will be described particularly with respect to such steps.

Referring now to the drawing, there is illustrated the apparatus for applying and drying a photoresist material on semiconductor wafers. The apparatus includes a horizontally reciprocal transporting carriage or tray 11 for moving semiconductor wafers between cassettes and accomodating first the application of a photoresist material to the wafer and then drying of the photoresist material by a simultaneous evacuation of the space surrounding the wafer and conducting heat to the wafer.

The tray 11 includes a central elongate rectilinear plate section 12 and narrower rectilinear loading and unloading rectilinear extensions 13 and 14, respectively, at opposite ends thereof. The central plate section 12 includes spaced apart first and second operating apertures 15 and 16 with a wafer carrying aperture 17 located therebetween. Each aperture projects entirely through the plate 12, and a substantially annular recess 17' in the top surface of the plate section 12 surrounds the carrying aperture 17. Similar wafer carrying apertures 18 and 19 are located in the loading and unloading extensions 13 and 14, respectively, each of the apertures 18 and 19 having a surrounding recess 18' and 19'.

A slot 20 is provided longitudinally of the tray 11 providing communication between the various apertures and the tray 11. A slot section 20A exists between apertures 18 and 15; a slot section 20B is located between apertures 15 and 17; a slot section 20C is located between apertures 17 and 16; and a slot section 20D is located between apertures 16 and 19. The tray 11 is mounted for horizontal reciprocal movement, typically driven by a pneumatic cylinder.

In FIG. 1 the tray 11 is shown in its start position between an input cassette 22 at an input cassette wafer loading station 21 and an output cassette 24 and an output cassette wafer unloading station 23. In between the input and output stations 21 and 23 are located first and second treating stations 31 and 41.

The treating station 31 is a photoresist application station and includes a wafer support plate or chuck 32 on the top of a vertically reciprocal and rotatable rod 33 driven by a mechanism (not shown) for raising, lowering and spinning the chuck 32. The rod 33 is centrally located within a cup-shaped photoresist retainer 34 positioned below the tray 11 and means such as nozzle 35 is provided for directing a stream of photoresist material on to a wafer positioned on the chuck 32. During the photoresist application, the support chuck is moved downwardly below the tray 11 and into the retainer 34 and then spun so that a uniform layer of photoresist material remains on the wafer.

The drying station includes a heating wafer support plate or chuck 42 with heating means, such as a heating coil, for conducting heat to a wafer positioned thereon. The chuck 42 is positioned on the top of a rod 43 which is vertically reciprocal through a vacuum chamber base plate 44 located below the tray 11. A vacuum chamber cover 45 is provided for vertical movement down onto the base plate 44 for sealing contact therewith such as with a sealing O-ring. With the cover 45 positioned in place on the base plate 44 the space surrounding the wafer is evacuated by means of a vacuum pump 47.

Both of the chucks 32 and 42 can be provided with a vacuum hold-on feature such as with means for drawing a vacuum through passages from the surface of the support chuck through the associated rod. In the first station this hold-down mechanism will better anchor the wafer during spinning, and in the second station this hold-on mechanism will provide better contact and therefore better heat conduction between the heating plate and the wafer.

The operating apertures 15 and 16 are sized relative to the wafer-carrying apertures 17, 18, and 19 so that the operations on the wafer at the stations do not interfere with the tray. For example, in a typical operating system for five-inch wafers, the diameter of the annular recesses 17', 18', and 19' is five inches whereas the diameter of the operating apertures 15 and 16 is seven and a half inches.

A typical sequence of operations utilizing the present invention will now be described with a cassette 22 full of wafers ready to be processed positioned at the loading station and an empty cassette 24 positioned at the unloading station 23. The tray 11 moves to the left to place wafer aperture 18 immediately below a wafer in the cassette 22. Typically the system will include detection and operational interlock systems for determining whether a wafer exists in the position where the tray 11 moves into the cassette. The chucks 32 and 42 are lowered to positions below the tray 11, and the cassette 22 is lowered so that the first wafer is picked off by the wafer recess 18'. The tray is then moved to the right so that aperture 18 is positioned over the wafer support chuck 32. The chucks 32 and 34 are then raised, and chuck 32 will pick off the first wafer from the recess 18'. The tray is then moved left to the starting position wherein the chuck 32 and 42 will be located in the operating apertures 15 and 16 respectively, and the chucks then lowered for operations. The first operation will take place by the application of photoresist material onto the wafer which is then spun for a selected period of time to produce the uniform layer of photoresist on the wafer. The chucks 32 and 42 are then raised and the tray 11 again moved left so that recess 18' is positioned within cassette 22 to pick off the next wafer and recess 17' is positioned below the wafer on chuck 32. The chucks are then lowered along with cassette 22 so that a new wafer to be treated is positioned in recess 18' and the wafer with applied photoresist is positioned in recess 17'. Next the tray is then moved to the right position recesses 18' and 17' over chucks 32 and 42 respectively. The chucks are raised lifting the two wafers off of the tray and the tray moved back to the starting position with the chucks 32 and 42 centered in the operating apertures 15 and 16, respectively. The chucks 32 and 42 are then lowered for performing the respective operations. Photoresist is applied to the second of the wafers as described. In the second operating station the vacuum chamber cover 45 is lowered onto the base plate 44. The space surrounding the wafer is evacuated while heat is conducted to the wafer from the chuck. In this manner vapors are drawn off from the applied photoresist without adversely affecting either the photoresist or the wafer. When the process is complete the vacuum is relieved and the cover 45 raised.

Next the chucks 32 and 34 are raised and the tray again moved to the left to position the recess 18' in the cassette, recess 17' below the wafer on chuck 32 and recess 19' below the wafer on chuck 42. The chucks are lowered and cassette 22 lowered placing wafers in the recesses 18', 17' and 19', and the tray moved to the right to position recess 18' over chuck 32, recess 17' over chuck 42, and recess 19' in the cassette 24 in the unloading station. The chucks 32 and 42 are then raised to pick up the wafers from recesses 18' and 17' and cassette 24 raised to pick up the wafer from recess 19'. The tray 11 is then moved back to the starting position and the chucks 32 and 42 lowered for the next operation.

The movement of the tray, the chucks, and the cassettes continue so that wafers are processed by first coating and then drying the photoresist until the cassette 22 is empty. Sensors will indicate that when the tray 11 moves to the loading station 21, no wafer will be located in recess 18'. During the next operation no photoresist will be applied while the last wafer being processed is being dried. When that last wafer is then moved into the cassette at the unloading station, the complete processing operation will be completed, ready for changing the cassettes at the loading and unloading station for new cassettes.

The terms and expressions which have been employed here are used as terms of description and not of limitations, and there is no intention, in the use of such terms and expressions of excluding equivalents of the features shown and described, or portions thereof, it being recognized that various modifications are possible within the scope of the invention claimed.

What is claimed is:

1. Apparatus for treating semiconductor wafers comprising a reciprocating wafer tray having
   at least three wafer carrying apertures, at least a pair of operating apertures each one located inbetween a different adjacent pair of said three wafer carrying apertures, and
   slots in the tray providing open access between at least certain of operating and carrying apertures;
means for reciprocating said tray back and forth between an input loading station and an output unloading station;
at least first and second treating stations inbetween said loading and unloading stations, each treating station having
   a wafer chuck vertically reciprocal through said operating apertures in said tray;
said first treating station having means for applying photoresist to a wafer; and
said second treating station having means for evacuating the space surrounding a wafer with applied photoresist and simultaneously conducting heat to the wafer from the wafer chuck.

* * * * *